United States Patent

Kahen

[11] Patent Number: 5,276,699
[45] Date of Patent: Jan. 4, 1994

[54] DEPRESSED-INDEX RIDGE WAVEGUIDE LASER DIODE CONTAINING A STABILIZING REGION

[75] Inventor: Keith B. Kahen, Rochester, N.Y.
[73] Assignee: Eastman Kodak Company, Rochester, N.Y.
[21] Appl. No.: 971,621
[22] Filed: Nov. 5, 1992
[51] Int. Cl.⁵ ............................................. H01S 3/19
[52] U.S. Cl. .............................. 372/45; 372/43; 372/44; 372/50; 372/48
[58] Field of Search ............... 372/7, 43, 44, 45, 46, 372/48, 50; 385/129, 130, 131, 132

[56] References Cited

U.S. PATENT DOCUMENTS

| | | |
|---|---|---|
| 4,185,256 | 1/1980 | Scifres et al. ............... 385/130 X |
| 4,328,469 | 5/1982 | Scifres et al. ............... 372/48 X |
| 4,840,446 | 6/1989 | Nakamura et al. ........... 385/132 X |
| 5,010,375 | 4/1991 | Seiwa ............................ 372/43 X |
| 5,010,376 | 4/1991 | Nishimura et al. ........... 372/43 X |
| 5,103,270 | 4/1992 | Sato et al. .................... 372/43 X |
| 5,109,464 | 4/1992 | Munowitz et al. ........... 385/132 X |
| 5,165,105 | 11/1992 | Haase et al. .................. 385/131 X |
| 5,175,740 | 12/1992 | Elman et al. ................. 372/45 |
| 5,210,767 | 5/1993 | Arimoto et al. .............. 372/45 X |
| 5,212,759 | 5/1993 | Brazas, Jr. et al. .......... 385/130 |

Primary Examiner—Brian Healy
Attorney, Agent, or Firm—Raymond L. Owens

[57] ABSTRACT

A stabilized depressed-index cladding ridge waveguide semiconductor laser diode having a graded (index of refraction) lower cladding layer.

6 Claims, 2 Drawing Sheets

DEPRESSED-INDEX RIDGE WAVEGUIDE LASER DIODE CONTAINING A STABILIZING REGION

CROSS-REFERENCE TO RELATED APPLICATIONS

Reference is made to commonly assigned U.S. patent application Ser. No. 07/971,647, filed Nov. 5, 1992 entitled "Ridge Waveguide Laser Diode With a Depressed-Index Cladding Layer" by Kahen et al, pending, and U.S. patent application Ser. No. 07/971,648, filed Nov. 5, 1992 entitled "A Ridge Waveguide Distributed-Feedback Laser Diode With a Depressed-Index Cladding Layer" by K. B. Kahen, pending, the teachings of which are incorporated herein by reference.

BACKGROUND OF THE INVENTION

In most semiconductor laser diode applications, it is desirable that the laser's threshold current be minimized. Thus, the trend has been toward devices containing (multiple-) quantum-well active regions. By operating at low currents, the devices generate less heat and, consequently, have longer lifetimes. However, in the pursuit of low threshold devices, the quality of the output beam has been somewhat neglected. Typically, the output beam is highly elliptical in shape, having far-field divergences in the planes parallel ($\theta_l$) and perpendicular ($\theta_t$) to the laser junction being on the order of 7° and 40°, respectively, resulting in a far-field divergence ratio, $p=\theta_t/\theta_l$, of $\sim 5.7$. For applications, such as, optical recording or laser coupling to an optical fiber, large divergence ratios are highly undesirable. Thus, recently some attention has been devoted to designing lasers with more circular output beams.

Both Yuri et al. (M. Yuri, A. Noma, I. Ohta, and M. Kazumura, 'Reduction of beam divergence angles perpendicular to the junction planes by modulating the refractive index profile in AlGaAs laser diodes', presented at the Fall 1991 meeting of the Japanese Society of Applied Physics) and Cockerill et al. (T. Cockerill, J. Honig, T. DeTemple, and J. Coleman, 'Depressed index cladding graded barrier separate confinement single quantum well heterostructure laser,' Appl. Phys. Lett., vol. 59, 2694, 1991) have introduced depressed-index cladding layers into their devices to significantly lower $\theta_t$. A schematic of an AlGaAs-based laser diode containing these layers in shown in FIG. 1. In the figure is indicated the Al content of the various layers, where 10 refers to the n+-GaAs substrate. On the surface of 10 is formed the lower cladding layer 12. Upon 12 is deposited the lower depressed-index cladding layer 14. The index of refraction of this layer is smaller than that of the surrounding layers since the index of refraction of AlGaAs materials is smallest for pure AlAs. On the surface of 14 is formed the lower spacer layer 16, followed by the active layer 18 and the upper spacer layer 20. Upon 20 is formed the upper depressed-index cladding layer 22 followed by the upper cladding layer 24. Lastly, upon the surface of 24 is formed the capping layer 26. Since light avoids low-index regions, the physical effect of the inclusion of the depressed-index cladding layers is to push the transverse-confined waveguide mode both toward the middle and ends of the structure. With greater light intensity present in the lower and upper cladding layers, $\theta_t$ decreases as desired. $\Gamma$ remains approximately stationary since light is also pushed towards the middle (active layer) of the structure. More specifically, Cockerill et al. determined that for a broad-area graded-index separate confinement heterostructure device, $\theta_t$ was 27° and 59° for structures with and without the inclusion of the depressed-index cladding layers, respectively. Finally, in the above-referenced copending application of Kahen et al., a single depressed-index cladding layer in the lower cladding region of a ridge waveguide laser diode is implemented. By employing only a single depressed-index layer, the interaction of the field with the rib structure is enhanced, while sufficient spreading of the modal-field is obtained.

This Kahen et al. laser diode is quite effective since its basis is a ridge waveguide laser diode which is simple to manufacture. However, the structure can become unstable for large rib etch depths. More specifically, the modal field at the edges of the rib (where the etched rib contacts the upper cladding layer) can oscillate in a number of different transverse modes for ribs etched deeply into the upper cladding layer, resulting in $\theta_l$ being a strong function of the etch depth and the laser being susceptible to lateral multimoding for small output powers. These transverse modes have nodal structure not in the active region, but in the lower cladding layer and occur for the following reasons. The placement of depressed-index cladding layers nearby the active region effectively takes intensity away from the active layer and redistributes it into the tails of the transverse modal-field distribution. Since light decays quickly at the edges of the rib, the modal-field distribution is cut-off closer to the active layer, causing a greater proportion of the light to leak into the lower cladding layer region. To avoid excessive substrate absorption losses it is then necessary to either increase the thickness of the lower cladding layer or to include a lower depressed-index buffer layer as per commonly-assigned U.S. patent application Ser. No. 923,763 filed Aug. 3, 1992, pending, to T. Hayakawa entitled "Laser Diode". Either way a thick "waveguide" is set-up in the lower cladding layer between the edges of the lower depressed-index cladding layer and the (substrate) lower depressed-index buffer layer, where the nodal structure occurs within this "waveguide" and the dominant mode is determined by the depth of the rib etch. Since the effective transverse index of refraction is smaller for modes with greater nodal structure, the degree of lateral confinement (and the value of $\theta_l$) is a function of the etch depth, making it difficult to control the shape of the output beam. Thus, the prior art has low manufacturing yields, since many of the devices would fall outside of desired specifications.

SUMMARY OF THE INVENTION

An object of this invention is to provide an improved depressed index cladding ridge waveguide semiconductor laser diode.

This object is achieved in a stabilized depressed-index cladding ridge waveguide semiconductor laser diode comprising:

(a) a semiconductor substrate of a first conductivity type;

(b) a depressed-index buffer layer of such first conductivity type deposited on the semiconductor substrate;

(c) a graded (index of refraction) lower cladding layer of such first conductivity type deposited on the depressed-index buffer layer;

(d) a depressed-index cladding layer of such first conductivity type formed on the graded lower cladding layer;

(e) a spacer layer of such first conductivity type deposited on the depressed-index cladding layer;

(f) a semiconductor active layer formed on the spacer layer;

(g) an upper cladding layer of a second conductivity type deposited on the semiconductor active layer;

(h) a capping layer of such second conductivity type formed on the upper cladding layer;

(i) a rib structure etched into the capping and upper cladding layers so as to provide lateral guiding; and (j) electrically conductive layers formed on the substrate and capping layers.

The depressed-index cladding ridge waveguide (DIC-RW) laser diode is stabilized by linearly grading the index of refraction of the lower cladding layer. More specifically, the index of refraction was linearly graded from a maximum at the endpoints of the layer to a minimum at its midpoint. As stated above, light avoids regions of low index of refraction, thus, by grading the index, it becomes less favorable to form a stable "waveguide" region in the lower cladding layer. Hence, the DIC-RW laser diode becomes more resistant to destabilization, requiring very deep rib etches to cause transverse mode hopping. Comparing the DIC-RW laser diode with and without grading the lower cladding, layer shows that for the claimed structure $\theta_l$ is a weaker function of the rib etch depth and remains in a single-transverse mode over a larger range of etch depths.

DETAILED DESCRIPTION OF THE PREFERRED EMBODIMENTS

According to the preferred embodiment, a depressed-index cladding ridge waveguide laser diode is stabilized by linearly grading the index of refraction of the lower cladding layer, resulting in $\theta_l$ and the far-field divergence ratio being a weaker function of the rib etch depth.

Figure 1:
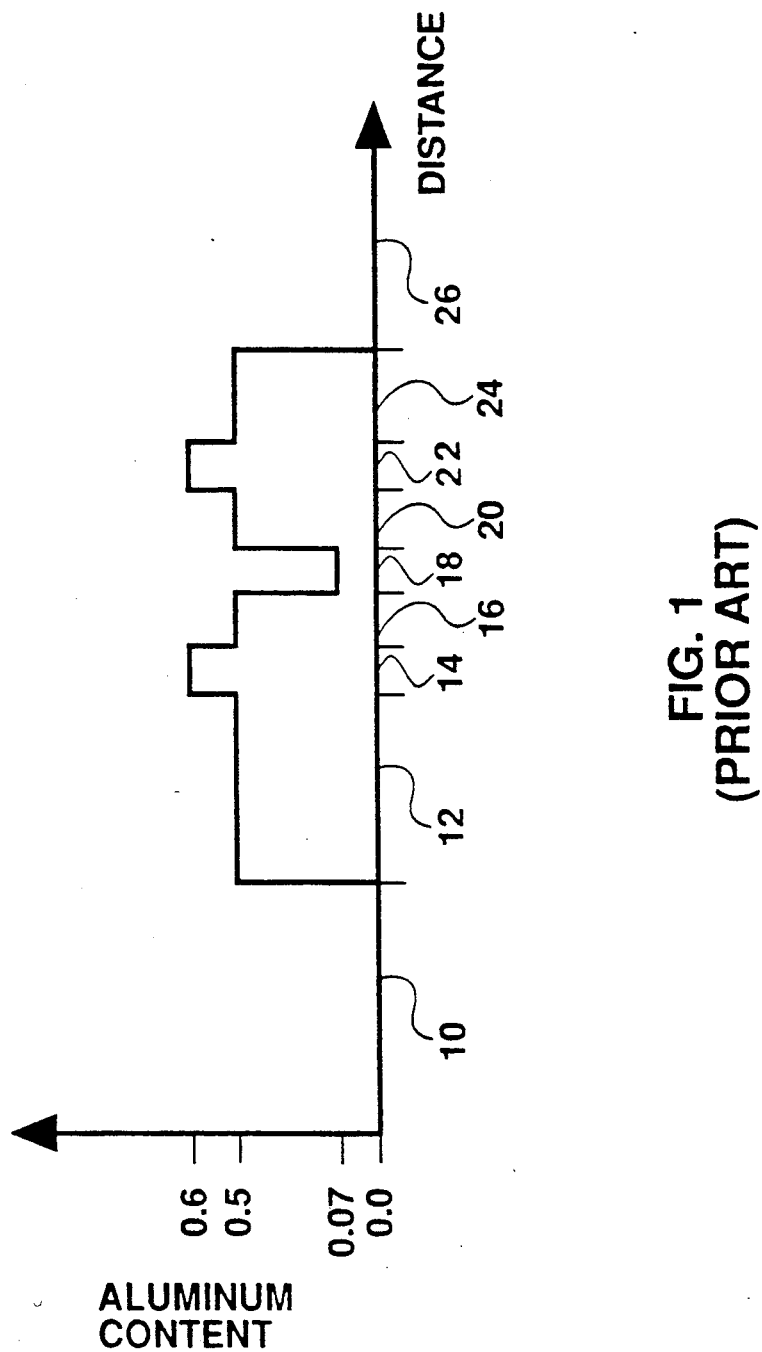
FIG. 1 shows a graph of Al content versus distance in a prior art structure.
Figure 2:
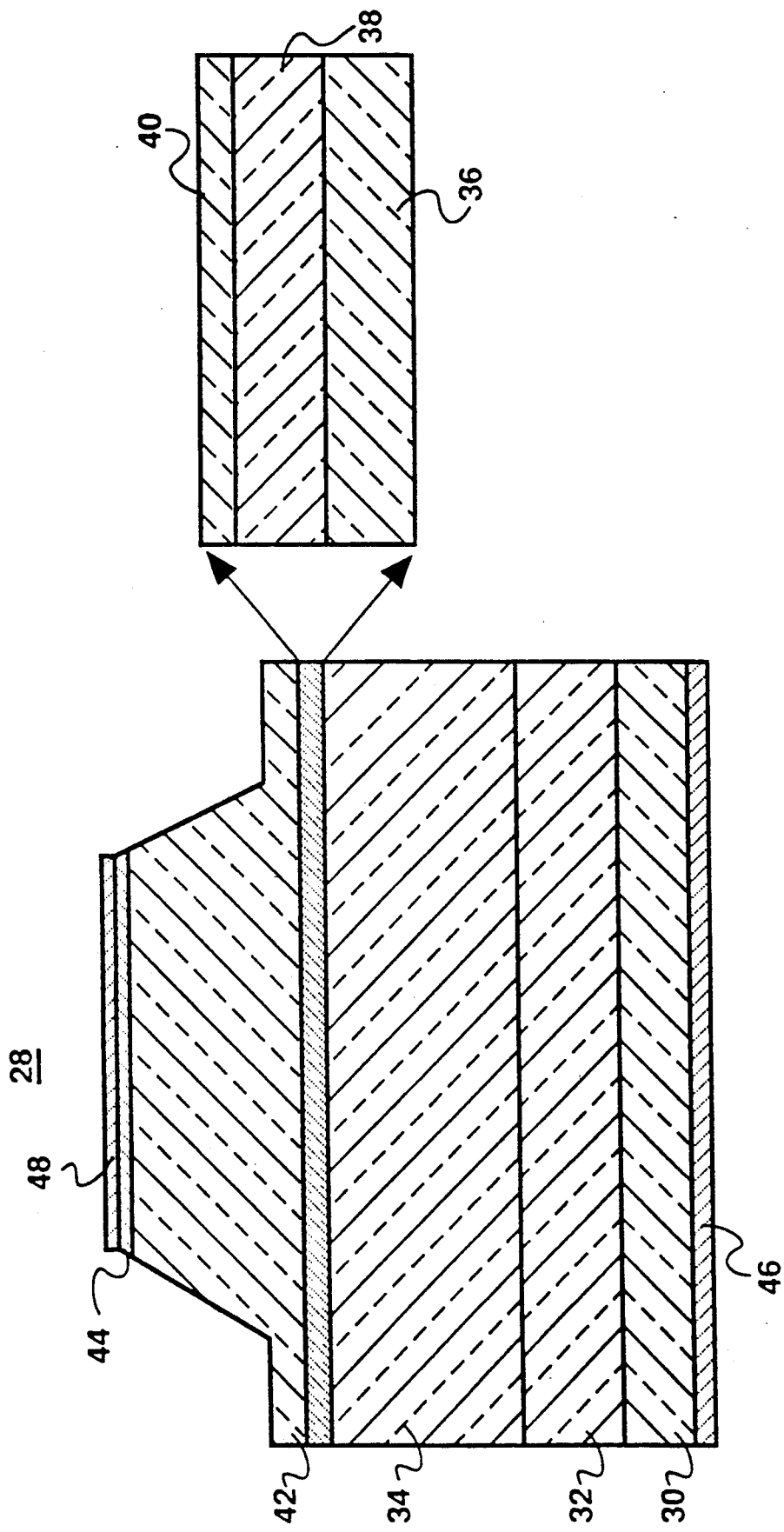
FIG. 2 shows in cross-section a laser diode in accordance with the invention.

In accordance with this invention, FIG. 2 shows a stabilized DIC-RW laser diode 28 in which a substrate 30 is highly doped n+-GaAs. In general, the substrate does not need to be composed of n+-GaAs. It can be composed of any highly conductive semiconductive material as long as the remaining layers can be grown epitaxially upon it. The remaining sections of the stabilized DIC-RW laser diode are comprised of a series of individual semiconductive layers of predetermined thicknesses and doping types, arranged epitaxially on the substrate 30, with ohmic metal contacts 46 and 48 located at the bottom and top of the stabilized DIC-RW laser diode 28, respectively. Finally, the longitudinal length of the DIC-RW laser diode is typically from 200 to 600 $\mu$m, and in the preferred embodiment, 500 $\mu$m.

Upon the n+-GaAs substrate 30 is grown a depressed-index buffer layer 32, having a nominal thickness of 1.0 $\mu$m. In the preferred embodiment the depressed-index buffer layer is comprised of n-type $Al_{0.45}Ga_{0.55}As$, although AlGaAs of other compositions and dopant types are possible. In addition, the depressed-index buffer layer can be comprised of materials from other semiconductive systems as long as they grow epitaxially on the substrate and its refractive index is smaller than that of the lower cladding layer. By incorporating a low index material adjacent to the substrate, the modal intensity becomes negligible inside of the substrate, effectively minimizing substrate absorption losses. The depressed-index buffer layer 32 is doped n-type with materials, such as, Si or Sn, to a concentration from $10^{17}$ to $10^{19}$ atoms/cm$^3$, with a preferred density of $5 \times 10^{17}$ atoms/cm$^3$. The preferred method of deposition is Molecular Beam Epitaxy (MBE) or Metal Organic Chemical Vapor Deposition (MOCVD); but, as is practiced in the art, many other methods of deposition, (e.g., Chemical Beam Epitaxy, Liquid Phase Epitaxy, or Atomic Layer Epitaxy) which accomplish epitaxial layers of controlled thicknesses and dopings, may be equally employed.

Upon the depressed-index buffer layer 32 is grown a graded lower cladding layer 34, having a nominal thickness of 2.0 $\mu$m. Since the index of refraction of AlGaAs decreases with increasing Al content, in the preferred embodiment the Al content of the layer is lowest at the endpoints, $Al_{0.40}Ga_{0.60}As$, and linearly grades to $Al_{0.43}Ga_{0.57}As$ at its midpoint. The layer is uniformly doped n-type to a density of $5 \times 10^{17}$ atoms/cm$^3$. Other compositions and material systems are possible as long as the layer can be grown epitaxially and its index of refraction can be smoothly varied. Comparing calculated results for the DIC-RW laser diode of FIG. 2 with and without grading layer 34 shows that: $\theta_l$ is approximately a factor of 1.5 times less sensitive to variations in the rib etch depth and remains in a single-transverse mode for the rib etched to 0.27 $\mu$m from the active layer, as opposed to 0.45 $\mu$m.

On the surface of layer 34 is formed a lower depressed-index cladding layer 36. For the preferred embodiment its composition is $n-Al_{0.66}Ga_{0.34}As$, having a thickness of 0.09 $\mu$m and a doping density of $5 \times 10^{17}$ atoms/cm$^3$. Other compositions and material systems are possible as long as the layer can be grown epitaxially and its refractive index is at least 5% smaller than that of the lower cladding layer. The amount of reduction in the transverse far-field divergence is mainly determined by the thickness and refractive index of the lower depressed-index cladding layer, its position relative to that of the active layer, and the refractive index grading of the graded lower cladding layer. Hence, the preferred embodiment results in one value for $\theta_l$, while other possibilities are attainable by suitably adjusting the above four parameters. The relative position of the lower depressed-index cladding layer is determined by the thickness of a spacer layer 38, which is formed on the layer 36. In the preferred embodiment its composition is $n-Al_{0.40}Ga_{0.60}As$, having a thickness of 0.09 $\mu$m and a doping density of $5 \times 10^{17}$ atoms/cm$^3$. It is desirable to have its composition and doping the same as that of the graded lower cladding layer at its endpoints.

In an active layer 40 (formed on layer 38) light is produced as a result of the recombination of electrons and holes injected from the lower (spacer layer) and upper cladding layers, respectively. Typically, the active layer 40 is composed of GaAs, having thicknesses ranging from 100 to 1000 Å. In the preferred embodiment the active layer is composed of $Al_{0.12}Ga_{0.88}As$, having a thickness is 0.05 $\mu$m. The composition is chosen for applications in optical recording, where a wavelength of 785 nm is preferable. However, in general, the active layer can be formed of other AlGaAs compositions or semiconductive materials, such as InGaAs, whose band gap is chosen to be smaller than that of the materials in the surrounding layers. In order to obtain a reasonable confinement factor, $\Gamma$, small active layer thicknesses (single quantum well) are impractical, resulting in choosing a bulk thickness of 500 Å. Instead of a single bulk layer, another possibility is comprising the active layer of multiple quantum wells, as is commonly practiced in the art. The preferred method of growth of the active layer is also MBE or MOCVD, but other methods which achieve epitaxial materials of high crystallographic quality would also be acceptable. The doping of the active layer lies typically in the range from 0 to $10^{17}$ dopant atoms/cm$^3$, preferably on the order of $10^{16}$ atoms/cm$^3$; and may be of either dopant type, preferably n-type.

On the surface of layer 40 is formed an upper cladding layer 42. For the preferred embodiment its composition is p-Al$_{0.40}$Ga$_{0.60}$As, having a thickness of 1.75 $\mu$m. Other compositions and material systems are possible as long as the layer can be grown epitaxially. The upper cladding layer is doped p-type with materials, such as, C, Be, or Zn, to a concentration from $10^{17}$ to $10^{19}$ atoms/cm$^3$, with a preferred density of $2 \times 10^{17}$ atoms/cm$^3$. On layer 42 is formed the p-GaAs capping layer 44, which is typically 0.1 to 0.3 $\mu$m and preferably is 0.2 $\mu$m. Its doping density is on the order of $10^{19}$ atoms/cm$^3$, preferably $5 \times 10^{19}$ atoms/cm$^3$. To provide electrical contact to the stabilized DIC-RW laser diode, ohmic metals 46 and 48, such as Pd-AuGe-Ag-Au and Ti-Pt-Au, respectively, are formed on the substrate and capping layers, respectively. It should be noted that the capping layer can also be n-type, if Zn diffusion is employed to provide electrical contact from the ohmic metal 48 to the upper cladding layer, 42.

In general, semiconductor laser diodes operate effectively by confining the electron-hole and light-intensity distributions to the active layer. In addition to confinement in this, transverse, direction, confinement of both distributions in the perpendicular, lateral, direction is also desired. In the preferred embodiment this is obtained by forming a ridge waveguide structure in the capping and upper cladding layers. As is well known to one practiced in the art, this requires etching a mesa in the capping and upper cladding layers, following their deposition and prior to metal deposition. The etching can be performed by either wet (chemical) or dry (e.g., reactive ion etching) techniques. In the preferred embodiment of FIG. 2, the rib has a width of 3 $\mu$m at the top of the capping layer, with its sidewalls inclined at an angle of $\sim 35°$ with respect to the vertical. Additionally, the rib etch is terminated 0.4 $\mu$m above the active layer so as to maximize the amount of lateral waveguiding, while being 0.13 $\mu$m above the position where the laser begins to transverse mode hop. Using these values results in calculated far-field characteristics for the preferred embodiment of 21.0° and 9.6° for $\theta_l$ and $\theta_h$, respectively, and therefore a far-field beam divergence ratio of 2.2, a large reduction over values typical for the prior art. It should be noted that other rib widths, etch depths, and side-wall inclinations are possible, where each combination results in slightly different output beam characteristics.

Thus, there is provided by the present invention a stabilized DIC-RW laser diode that employs a graded lower cladding layer to minimize output beam fluctuations due to rib etch depth variations. By virtue of grading the lower cladding layer it becomes possible to improve the reproducibility of the output beam characteristics of DIC-RW laser diodes, thus lowering the cost of manufacturing them relative to that of the prior art. In general, laser diodes having nearly circular output beams, such as, the DIC-RW laser diodes, are highly desirable since they significantly reduce the cost of optical recording systems and they lower the coupling loss of laser end-firing into optical fibers.

Advantages

The usage of a graded lower cladding layer enables one to reduce variations in the far-field divergence ratio due to rib-etching process variations with only a minimal change in the structure of typical depressed-index cladding ridge waveguide laser diodes. In addition, comparisons made with the prior art show that our structure remains in a single-transverse mode over a larger range of etch depths and begins lateral multimoding for higher output powers. Accordingly, manufacturing costs can be reduced relative to the prior art.

The invention has been described in detail with particular reference to certain preferred embodiments thereof, but it will be understood that variations and modifications can be effected within the spirit and scope of the invention.

What is claimed is:

1. A stabilized depressed-index cladding ridge waveguide semiconductor laser diode comprising:
    (a) a semiconductor substrate of a first conductivity type;
    (b) a depressed-index buffer layer of such first conductivity type deposited on the semiconductor substrate;
    (c) a graded (index of refraction) lower cladding lower of such first conductivity type deposited on the depressed-index buffer layer;
    (d) a depressed-index cladding layer of such first conductivity type formed on the graded lower cladding layer;
    (e) a spacer layer of such first conductivity type deposited on the depressed-index cladding layer;
    (f) a semiconductor active layer formed on the spacer layer;
    (g) an upper cladding layer of a second conductivity type deposited on the semiconductor active layer;
    (h) a capping layer of such second conductivity type formed on the upper cladding layer;
    (i) a rib structure etched into the capping and upper cladding layers so as to provide lateral guiding; and
    (j) electrically conductive layers formed on the substrate and capping layers.

2. The stabilized depressed-index cladding ridge waveguide semiconductor laser diode of claim 1 in which the conductivity of the substrate is either n- or p-type.

3. The stabilized depressed-index cladding ridge waveguide semiconductor laser diode of claim 1 in which the capping layer is n-type and zinc is diffused into the capping and upper cladding layers.

4. The stabilized depressed-index cladding ridge waveguide semiconductor laser diode of claim 1 in which the semiconductor material system is AlGaAs.

5. The stabilized depressed-index cladding ridge waveguide semiconductor laser diode of claim 4 in which the semiconductor active layer is composed of InGaAs.

6. The stabilized depressed-index cladding ridge waveguide semiconductor laser diode of claim 1 in which the semiconductor active layer is composed of multiple-quantum wells.

* * * * *